(12) United States Patent
Nassar (10) Patent No.: US 12,218,652 B2
(45) Date of Patent: Feb. 4, 2025

(54) AUTONOMOUS POWER SUPPLY SWITCH

(71) Applicant: Renesas Design Austria GmbH, Graz (AT)

(72) Inventor: Hamzeh Nassar, Graz (AT)

(73) Assignee: Renesas Design Austria GmbH, Graz (AT)

( * ) Notice: Subject to any disclaimer, the term of this patent is extended or adjusted under 35 U.S.C. 154(b) by 0 days.

(21) Appl. No.: 18/712,107

(22) PCT Filed: Nov. 23, 2022

(86) PCT No.: PCT/EP2022/083040
§ 371 (c)(1),
(2) Date: May 21, 2024

(87) PCT Pub. No.: WO2023/104525
PCT Pub. Date: Jun. 15, 2023

(65) Prior Publication Data
US 2024/0333274 A1    Oct. 3, 2024

(30) Foreign Application Priority Data
Dec. 7, 2021   (EP) .................................... 21212828

(51) Int. Cl.
*H03K 17/00*        (2006.01)
*H03K 17/693*       (2006.01)

(52) U.S. Cl.
CPC ......... *H03K 17/005* (2013.01); *H03K 17/693* (2013.01)

(58) Field of Classification Search
None
See application file for complete search history.

(56) References Cited

U.S. PATENT DOCUMENTS 5,157,291 A * 10/1992 Shimoda .............. H03K 17/693
                                                    327/434
5,517,153 A    5/1996 Mn et al.
(Continued)

FOREIGN PATENT DOCUMENTS

JP    H04163652 A    6/1992

OTHER PUBLICATIONS

International Search Report and Written Opinion, mailed Feb. 28, 2023, from PCT/EP2022/083040, 14 pages.
(Continued)

*Primary Examiner* — Kenneth B Wells
(74) *Attorney, Agent, or Firm* — Workman Nydegger (57) ABSTRACT

An autonomous power supply switch with a main supply input and a backup supply input and a supply output to supply the power provided at the main supply input and to switch to the backup supply input, if the power at the main supply input is below a switch threshold. The switch includes a first switch transistor connected between the main supply input and the supply output with its gate/base connected to a first steering point of the switch and a second switch transistor connected between the backup supply input and the supply output with its gate/base connected to a second steering point of the switch; an inverter or Schmitt trigger with its input connected to the second steering point and its output connected to the first steering point and its power supply connected to the backup supply input of the switch.

7 Claims, 7 Drawing Sheets

(56) References Cited

U.S. PATENT DOCUMENTS

| | | | | |
|---|---|---|---|---|
| 5,608,273 | A * | 3/1997 | Bartlett | H02J 9/061 307/64 |
| 5,703,415 | A * | 12/1997 | Tanaka | G11C 5/141 307/66 |
| 5,783,964 | A * | 7/1998 | Eitan | G11C 5/141 327/143 |
| 5,886,561 | A | 3/1999 | Eitan et al. | |
| 6,118,188 | A | 9/2000 | Youssef | |
| 6,285,091 | B1 * | 9/2001 | Chan | H02J 9/061 307/64 |
| 6,420,906 | B1 * | 7/2002 | Kohda | H03K 17/693 326/113 |
| 6,522,190 | B1 * | 2/2003 | Malik | H02J 1/108 307/64 |
| 6,566,935 | B1 * | 5/2003 | Renous | G05F 1/59 327/530 |
| 6,642,750 | B1 * | 11/2003 | Egan | H02J 1/08 327/63 |
| 7,142,038 | B2 * | 11/2006 | Baglin | H03K 17/005 327/410 |
| 7,800,433 | B2 * | 9/2010 | Yoshikawa | H03K 17/693 327/547 |
| 8,772,966 | B1 * | 7/2014 | Agrawal | H02J 1/08 307/80 |
| 9,252,750 | B2 * | 2/2016 | Umeyama | G06F 1/263 |
| 9,298,238 | B2 * | 3/2016 | Mann | H03K 17/62 |
| 9,735,614 | B2 * | 8/2017 | Batra | H02J 9/061 |
| 9,787,135 | B2 * | 10/2017 | Yasukawa | H02J 1/10 |
| 9,811,062 | B2 * | 11/2017 | Akebono | H03J 9/00 |
| 10,788,852 | B2 * | 9/2020 | Neri | H02J 1/10 |
| 2002/0039034 | A1 | 4/2002 | Kohda | |
| 2015/0005976 | A1 | 1/2015 | Akebono et al. | |

OTHER PUBLICATIONS

International Preliminary Report on Patentability, mailed Mar. 14, 2024, from PCT/EP2022/083040, 20 pages.

* cited by examiner

AUTONOMOUS POWER SUPPLY SWITCH

FIELD OF THE INVENTION

The present invention relates to an autonomous power supply switch with a main supply input and a backup supply input and a supply output to which a power consumer may be connected to supply the power consumer with power provided at the main supply input and to switch to the backup supply input, if the power provided at the main supply input is below a switch threshold of the autonomous power supply switch.

BACKGROUND OF THE INVENTION

There are all kinds of different examples where a power consumer like an integrated circuit or a discrete circuit or a consumer device needs to be powered by either a main power source or in case this drops below a switch threshold by a backup power source. A power supply switch is needed to ensure that the main power source and the backup power source are disconnected from each other all the time and to ensure that the main power source is connected with the power consumer as long as the main power source delivers enough power. It is furthermore essential to ensure that the power supply switch only needs a short time to switch from main power source to the backup power source, if the main power source is not able anymore to deliver enough power to ensure stable operation of the power consumer.

Known power supply switches comprise a controller to measure the voltage of the main power source and compare it with the switch threshold voltage and to activate the mechanical or electronic switch to switch over from the connection of main power source with the power consumer to the connection of the backup power source with the power consumer. The switch of the power supply switch could be realized as mechanical relays or a power transistor like e.g. a thyristor. These known power supply switches comprise the disadvantage that the controller needs to be powered as well to work properly, what needs to be ensured by a separate power supply for the controller like a battery.

Document US5886561 A discloses a switching circuit for switching between a main power supply and a battery power supply which uses a p-channel battery power transfer transistor, a p-channel main power transfer transistor and an inverter. This prior art switching circuit comprises a comparator with its output enabling a second steering point. This comparator increases the complexity, power consumption and prone to errors of the switching circuit.

SUMMARY OF THE INVENTION

It is an object of the invention to provide a power supply switch that is robust and always works in a proper and safe way. This object is achieved with a power supply switch as defined in claim 1.

This concept of an autonomous power supply switch comprises a first and a second switch transistor. These transistors may be realized by bipolar transistors with the paths between their collector and emitter terminals switched by their potential/voltage at the base terminals or may be realized by a field-effect transistor with the paths between the source and drain terminals switched by the potential on its gate terminal. Furthermore, these transistors may be realized as N-channel or NPN type transistors with a normal logic or as P-channel or PNP type transistors with an inverted logic. The claimed autonomous power supply switch may be realized with these types of transistors. In its simplest embodiment, an inverter is connected between the second steering point and the first steering point. Furthermore the "threshold", when these switch transistors switch, can be at any voltage depending on the switch transistor itself, and also on the technology node used (0.18 μm or 40 nm, etc.). It can be at 0.7V or 0.5V or 0.3V. These thresholds of the switch transistors are different from the overall "switch threshold" of the autonomous power supply switch, which depends on the internal structure of the inverter. Fine tuning the switch threshold to the required voltage can be done through careful selection and sizing of the switch transistors, combined with careful sizing of the push and pull transistors in the inverter relative to the size and gate capacitance of the switch transistors it is driving and can be in the range as explained below.

This simple way to connect the two switch transistors and the inverter with a first and second steering point in-between the main supply input, backup supply input and the supply output provides the advantages that neither a controller with an own power supply, nor a measurement or comparison means are needed. Therefore, a fast, robust, and safe way to switch between the two different power sources with a priority on the main power source is achieved.

In a second embodiment of the invention, the claimed autonomous power supply switch may be realized with a Schmitt trigger instead of the inverter. The Schmitt trigger introduces hysteresis so that the ON switch threshold voltage is higher than the OFF switch threshold voltage. This prevents any oscillations on the first steering point in case of relatively high startup current load on the supply output that causes the voltage on an unbuffered supply connected to the main supply input to spike down.

In a further embodiment, a control transistor connected between the main supply input and ground potential with its gate/base connected to the first steering point enables some remaining electrical charge to still present at the main supply input at the time the main power source went down will be short circuited to ground potential, which safeguards the gate/base terminal of the first switch transistor from switching off the connection between the main supply input and the supply output. This increases the security and robustness of the power supply switch and prevents reverse currents into the main supply input.

In a further embodiment, an ohmic resistor connected between the main supply input and the second steering point of the switch is used to protect the second switch transistor and the inverter or Schmitt trigger from voltage peaks at the main supply input. This increases the robustness of the power supply switch against voltage spikes and safeguards against potential damage.

These and other aspects of the invention will be apparent from and elucidated with reference to the embodiments described hereinafter. A person skilled in the art will understand that various embodiments may be combined.

DETAILED DESCRIPTION OF EMBODIMENTS

Figure 1:
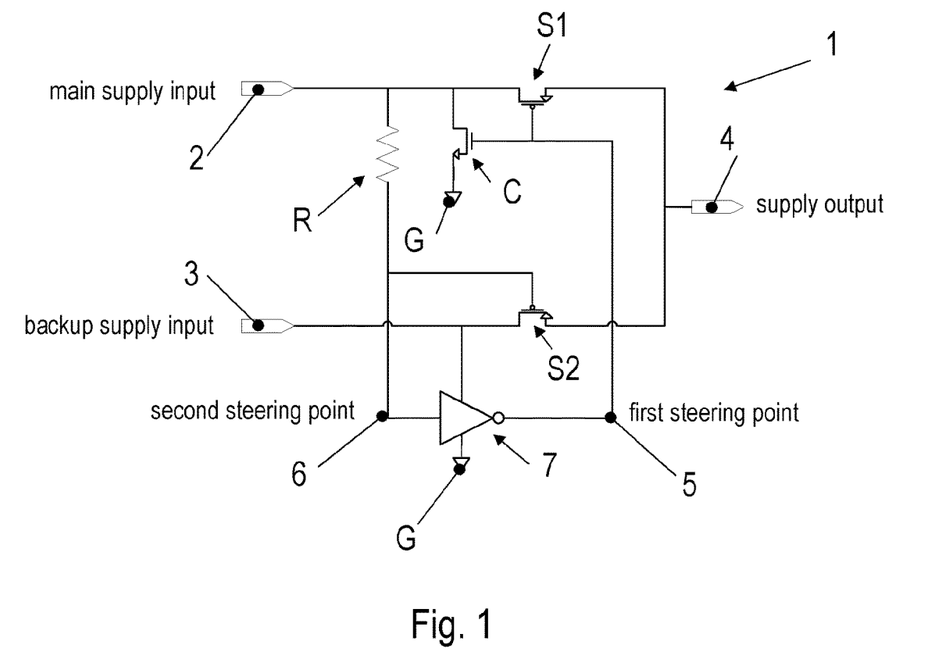
FIG. 1 shows a first embodiment of an autonomous power supply switch according to the invention using transistors of the PMOS type.

FIG. 1 shows an autonomous power supply switch 1 with a main supply input 2 and a backup supply input 3 and a supply output 4 to which a power consumer may be connected. A power consumer could for instance be an integrated circuit that needs to be supplied with DC 5V or a discrete circuit that needs to be supplied with DC 9V or a consumer device that needs to be supplied with DC 12V to name some examples. Depending on the transistors used, voltages of DC 100V or more with different current strength and power could be switched. There is a need that the power consumer is supplied with power even if the power provided by a main power source connected to the main power supply 2 drops below a switch threshold. In that case the power supply switch 1 needs to switch autonomously and as fast as possible to a backup power source connected to the backup power supply 3 to continuously provide the power needed at the supply output 4. The main and backup power sources could be a battery, an accumulator, a power network or comparable devices or sources to provide the power needed. Power is meant to cover a specified voltage within an upper and a lower limit and an electrical current within an upper and lower limit needed by the power consumer. The relevant switch threshold to switch from the main power source to the backup power source is a voltage level.

In this first embodiment of the invention, the power consumer is an integrated circuit that needs to be powered with a voltage of DC 1.8V, within the limits of maximal DC 3.3V and minimal DC 1.1V. The switch threshold of the autonomous power supply switch 1 has been set to DC 1.4V. Other switch thresholds could be realized by careful selection and sizing of the switch transistors S1 and S2 as explained below, combined with careful sizing of the push and pull transistors in the inverter relative to the size and gate capacitance of the switch transistors it is driving.

Figure 12:
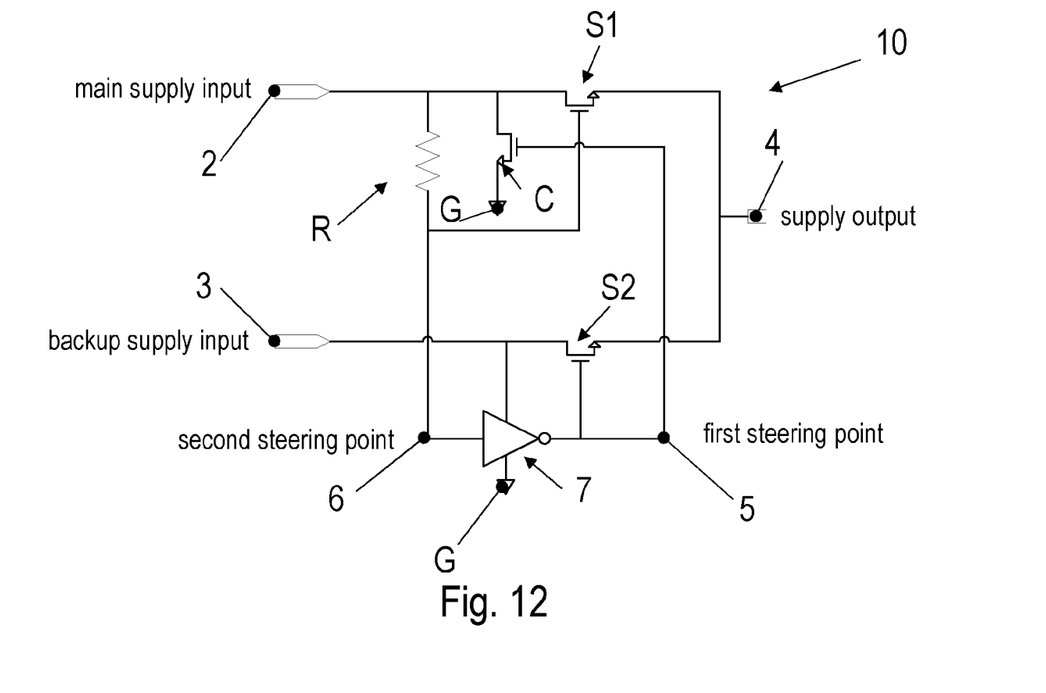
FIG. 12 shows a third embodiment of the invention that is similar to the first embodiment as shown in FIG. 1, but uses transistors of the NMOS type.

Switch 1 comprises a first switch transistor S1 connected between the main supply input 2 and the supply output 4 in such a way that its drain is connected to the main supply input 2 and its source and bulk are connected to the supply output 4. At its gate, the first switch transistor S1 is connected to a first steering point 5 of the switch 1. Switch 1 furthermore comprises a second switch transistor S2 connected between the backup supply input 3 and the supply output 4 in such a way that its drain is connected to the backup supply input 3 and its source and bulk are connected to the supply output 4. At its gate, the second switch transistor S2 is connected to a second steering point 6 of the switch 1. Both switch transistors S1 and S2 are realized as MOSFET transistors of the PMOS type and could be realized as MOSFET transistors of the NMOS type with an inverted logic as shown in FIG. 12, where the bulks of the first switch transistor S1 and the second switch transistor S2 are connected to ground potential G. Furthermore, both switch transistors S1 and S2 could be realized as NPN type transistors with normal logic as well as BJT transistors of the PNP type with an inverted logic. This means that main supply input 2 and supply output 4 are connected via the source and drain terminals of the first switch transistor S1, if the gate terminal of the first switch transistor S1 is low (i.e. at ground potential G or close to ground potential G). The first switch transistor S1, on the other hand, disconnects main supply input 2 from supply output 4, if the gate terminal of the first switch transistor S1 is high (i.e. at same voltage potential as the main supply input 2 or close to voltage potential of the main supply input 2).

The switch 1 furthermore comprises an inverter 7 with its input connected to the second steering point 6, its output connected to the first steering point 5, and its power supply connected to the backup supply input 3 of the switch 1. Ground potential G is the zero reference level for all other potentials and voltages of the switch 1.

In a preferred embodiment of the invention as shown in FIG. 1, switch 1 furthermore comprises a control transistor C connected with its source and drain terminal between the main supply input 2 and ground potential G in such a way that its drain is connected to the main supply input 2 and its source is connected to ground potential G. At its gate, the control transistor C is connected to the first steering point 5. This control transistor C is realized as a weak pull-down transistor to pull the potential of the main supply input 2 to ground potential G, if the main supply input 2 is floating (i.e. high impedance). This control transistor C enables some remaining electrical charge that is still present at the main supply input 2 at the time the main power source went down to be short circuited to ground potential G and ensures that the second steering point 6 is successfully discharged and pulled to ground potential G, in turn causing inverter 7 to drive the first steering point 5 high, thereby opening the first switch transistor S1 which switches off the connection between the main supply input 2 and the supply output 4. This increases the security and robustness of the power supply switch 1.

In a preferred embodiment of the invention as shown in FIG. 1, switch 1 furthermore comprises an ohmic resistor R connected between the main supply input 2 and the second steering point 6 of the switch 1 to protect the second switch transistor S2 and the inverter 7 of the switch 1 against voltage spikes. Such voltage spikes may happen if a new main supply source is connected to the main supply input 2 which could create voltage spikes due to electrostatic discharge of more than 100V peak which could damage the transistors.

The functionality of the autonomous power supply switch 1 will now be explained as follows. Since main supply input 2 has priority, it is used as the main supply source for the power consumer. When the main supply input 2 is turned ON, it drives the gate of the second switch transistor S2 high, thereby opening the second switch transistor S2 and isolating the supply output 4 from the backup supply input 3. Whether a backup supply source is connected to backup supply input 3 and a voltage is present or not is not relevant. As long as the main supply input 2 is ON, the gate terminal of the first switch transistor S1 will always be driven low, thereby closing the first switch transistor S1 and connecting the supply output 4 to the main supply input 2. This is due to the fact that when the backup supply input 3 is OFF, the inverter 7 is not supplied, and therefore the output is zero, which closes first switch transistor S1. Furthermore, when the backup supply input 3 is ON, it supplies the inverter 7, which will again output a zero due to its high input voltage level coming from main supply input 2 at the second steering point 6.

In the case where both the main supply input 2 and the backup supply input 3 are present, and suddenly main supply input 2 disappears, the input voltage on the inverter 7 will drop, thereby causing the inverter output to switch to high and open first switch transistor S1 and turning ON the control transistor C. The control transistor C will ensure that the voltage at the main supply input 2 is pulled to ground potential G, even if the main supply input 2 is left floating (high impedance). This in turn will close the second switch transistor S2 and connect the supply output 4 to the backup supply input 3, effectively creating a voltage supply redundancy.

According to above explanation of the functionality of the autonomous power supply switch 1, a method is realized to supply the power consumer connected to the autonomous power supply switch 1 according to FIG. 1 with priority with the main power source connected to the main supply input 2 or with the backup power source connected to the backup supply input 3. This method comprises the following steps:

Connect the main supply input 2 with the supply output 4 via the first switch transistor S1 and disconnect the backup supply input 3 from the supply output 4 via the second switch transistor S2, if the voltage provided at the main supply input 2 is above the switch threshold of DC 1.4V. Furthermore, connect the backup supply input 3 with the supply output 4 via the second switch transistor S2 and disconnect the main supply input 2 from the supply output 4 via the first switch transistor S1, if voltage provided at the main supply input 2 is below the switch threshold. Furthermore, connect the main supply input 2 with ground potential G via the control transistor C, if voltage provided at the main supply input 2 is below the switch threshold of DC 1.4V. These switch thresholds of the autonomous power supply switch are just examples and could be configured to any other voltage level a person skilled in the art deems useful.

Figure 2:
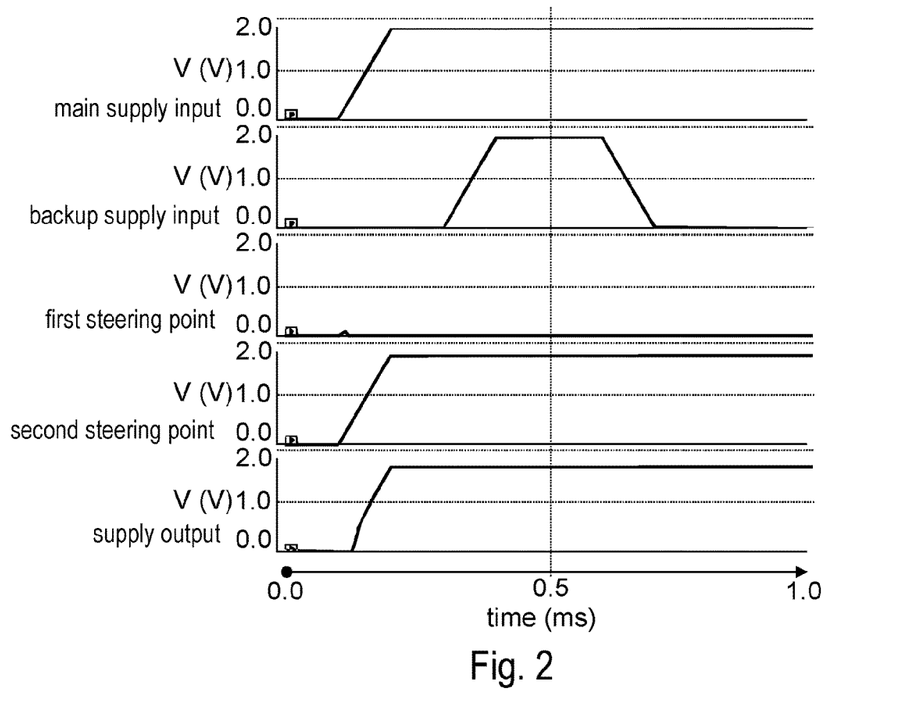
FIGS. 2 to 10 show voltage signals over time at relevant locations of the autonomous power supply switch of FIG. 1 in different constellations of supply inputs.

FIGS. 2 to 10 show voltage signals over time at relevant locations of the autonomous power supply switch 1 of FIG. 1 in different constellations of supply inputs. FIG. 2 shows an example of the voltage signals at the stated locations, if main supply source connected to main supply input 2 is switched ON and backup supply source at backup supply input 3 switches ON to DC 1.8V and later OFF to DC 0V again.

Figure 3:
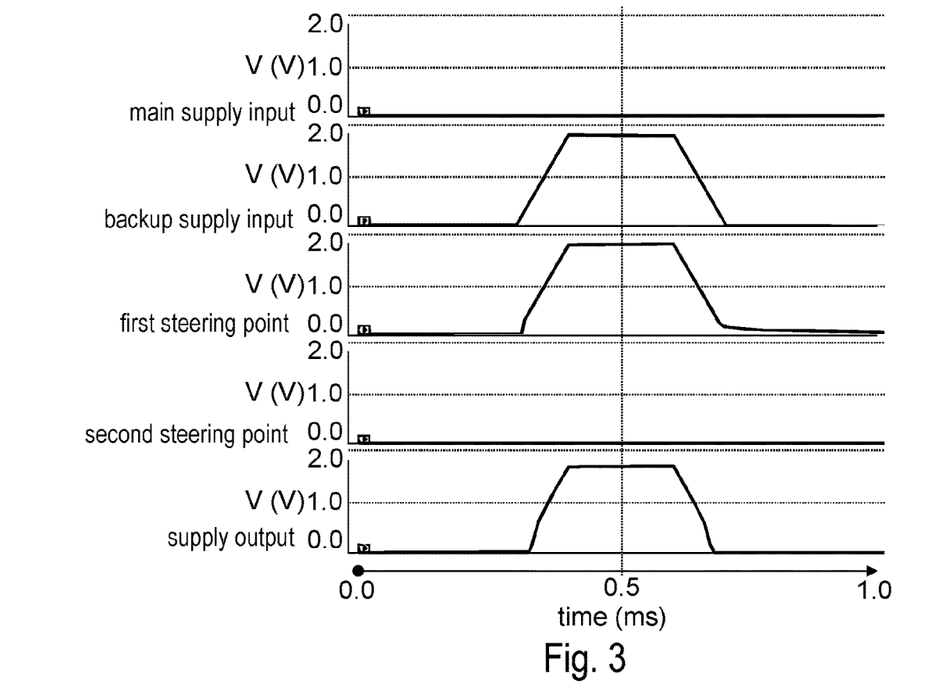

FIG. 3 shows an example of the voltage signals at the stated locations, if main supply source connected to main supply input 2 is OFF and backup supply source at backup supply input 3 switches ON to DC 1.8V and later OFF to DC 0V again.

Figure 4:
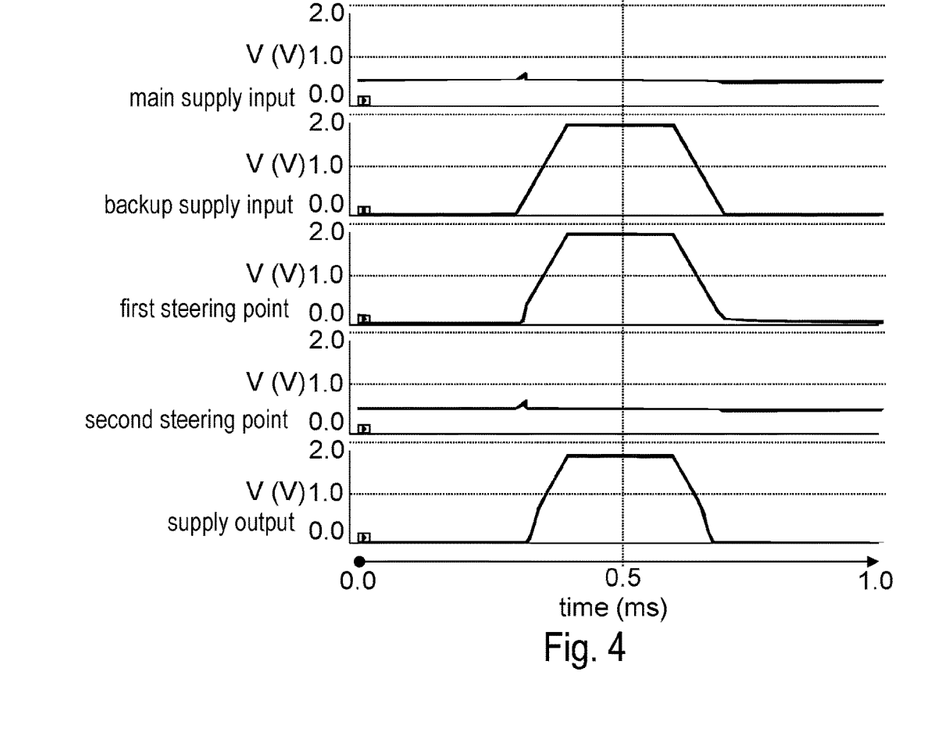

FIG. 4 shows an example of the voltage signals at the stated locations, if main supply source connected to main supply input 2 is FLOATING and backup supply source at backup supply input 3 switches ON to DC 1.8V and later OFF to DC 0V again.

Figure 5:
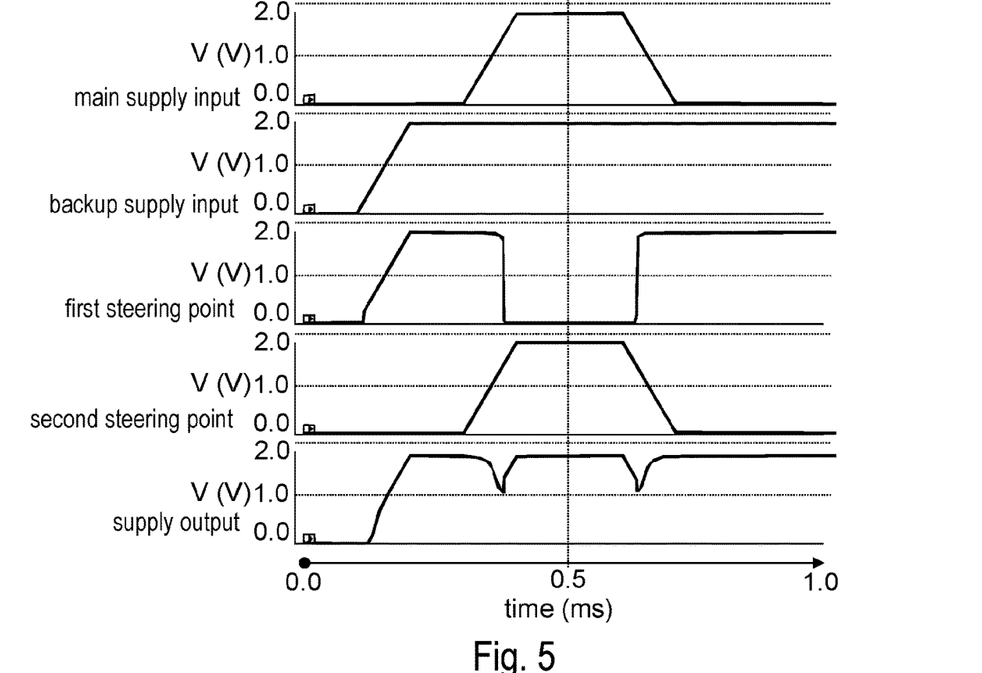

FIG. 5 shows an example of the voltage signals at the stated locations, if backup supply source connected to backup supply input 3 is ON and main supply source at main supply input 2 switches ON to DC 1.8V and later OFF to DC 0V again.

Figure 6:
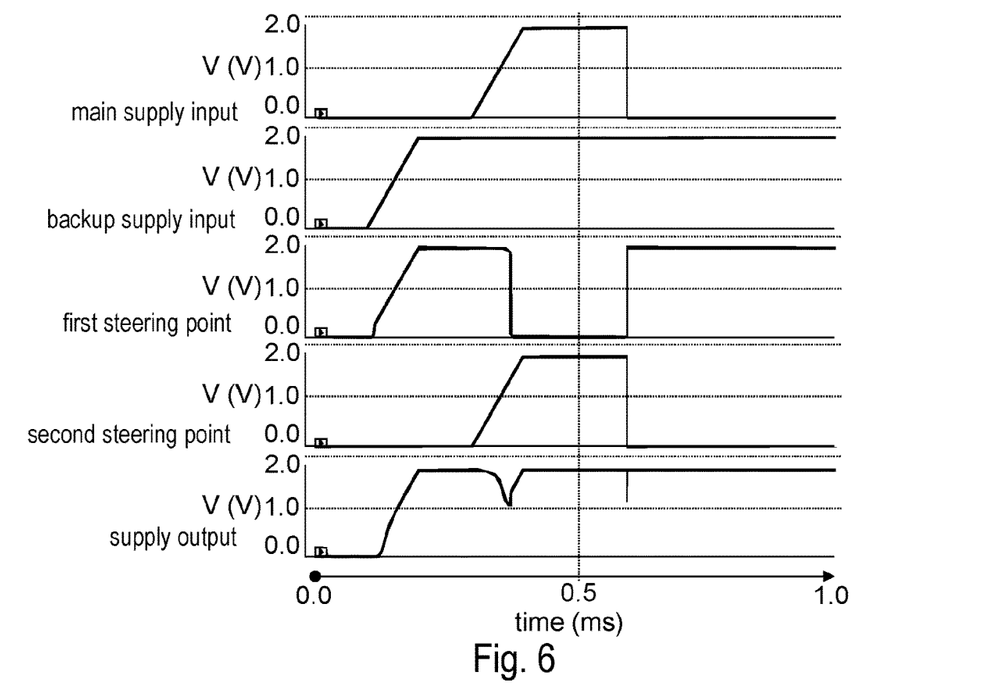

FIG. 6 shows an example of the voltage signals at the stated locations, if backup supply source connected to backup supply input 3 is ON and main supply source at main supply input 2 switches ON to DC 1.8V and later is FLOATING.

Figure 7:
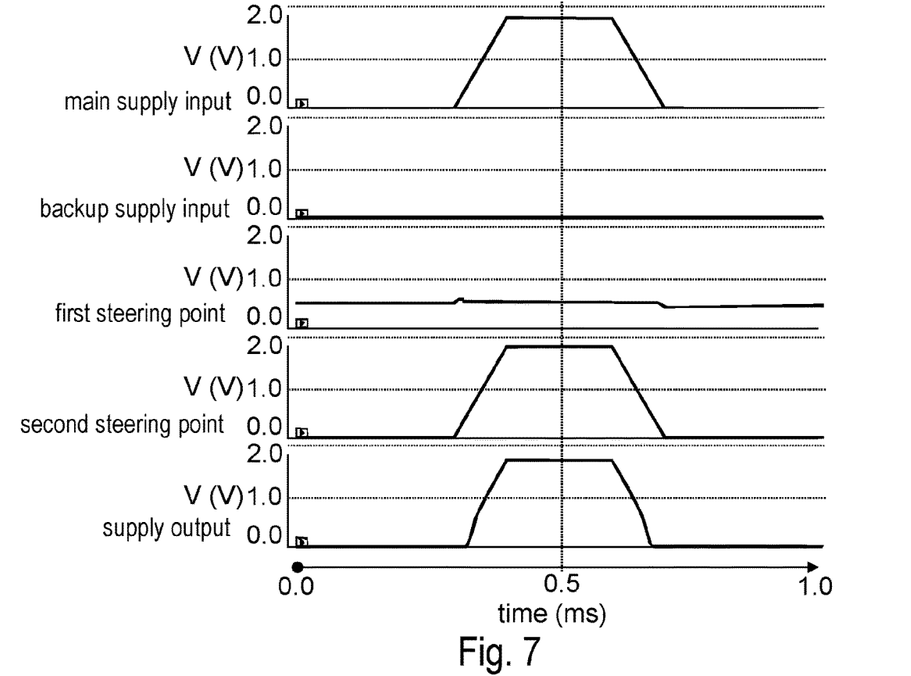

FIG. 7 shows an example of the voltage signals at the stated locations, if backup supply source connected to backup supply input 3 is OFF and main supply source at main supply input 2 switches ON to DC 1.8V and later OFF to DC 0V again.

Figure 8:
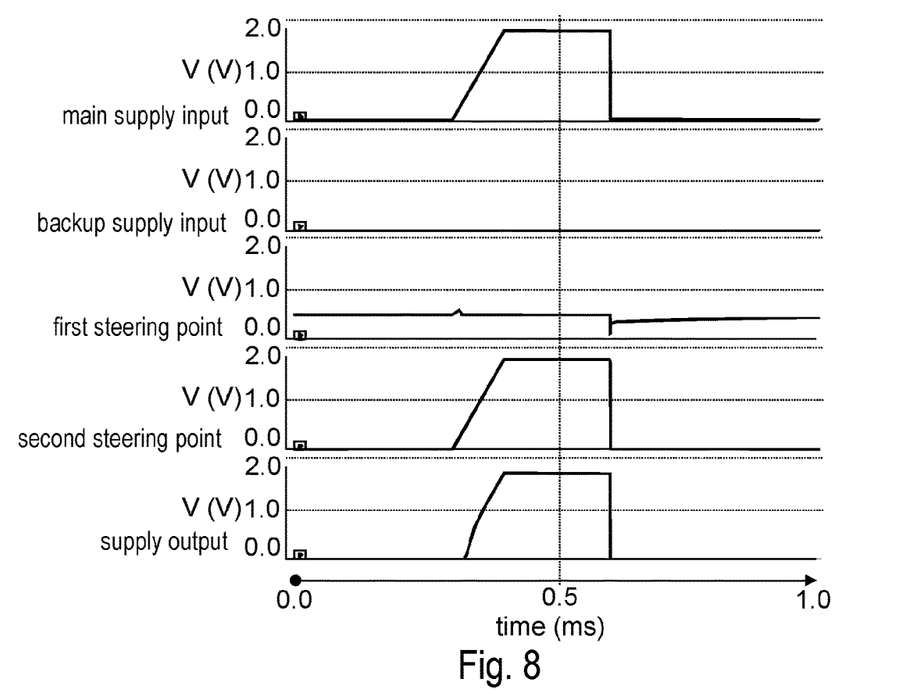

FIG. 8 shows an example of the voltage signals at the stated locations, if backup supply source connected to backup supply input 3 is OFF and main supply source at main supply input 2 switches ON to DC 1.8V and later is FLOATING.

Figure 9:
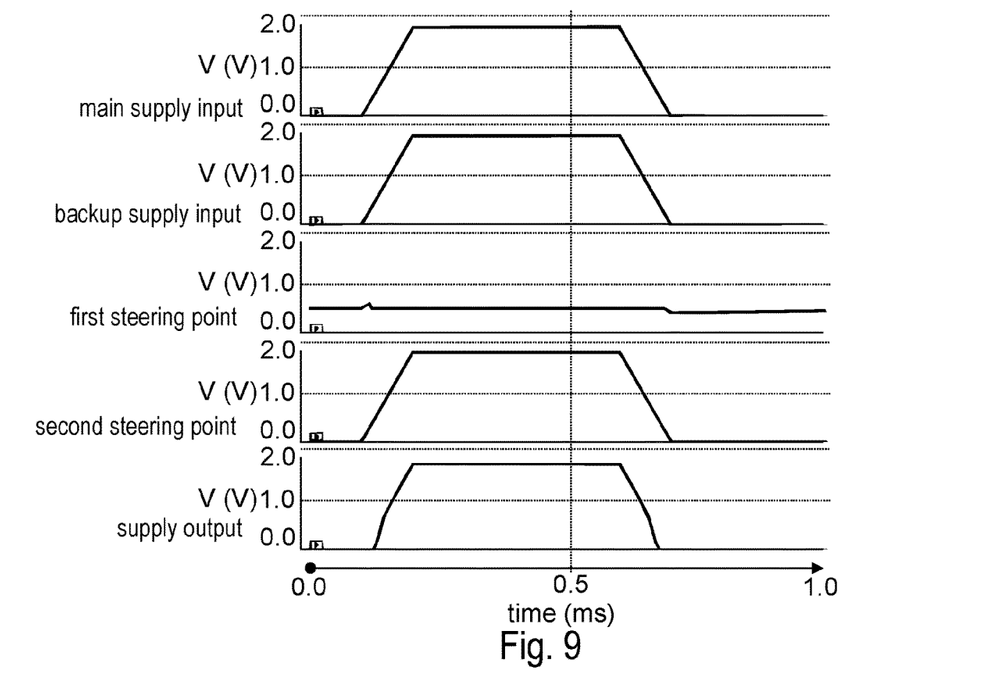

FIG. 9 shows an example of the voltage signals at the stated locations, if the main supply source connected to the main supply input 2 and the backup supply source connected to backup supply input 3 RAMP UP together switching ON and then OFF again.

Figure 10:
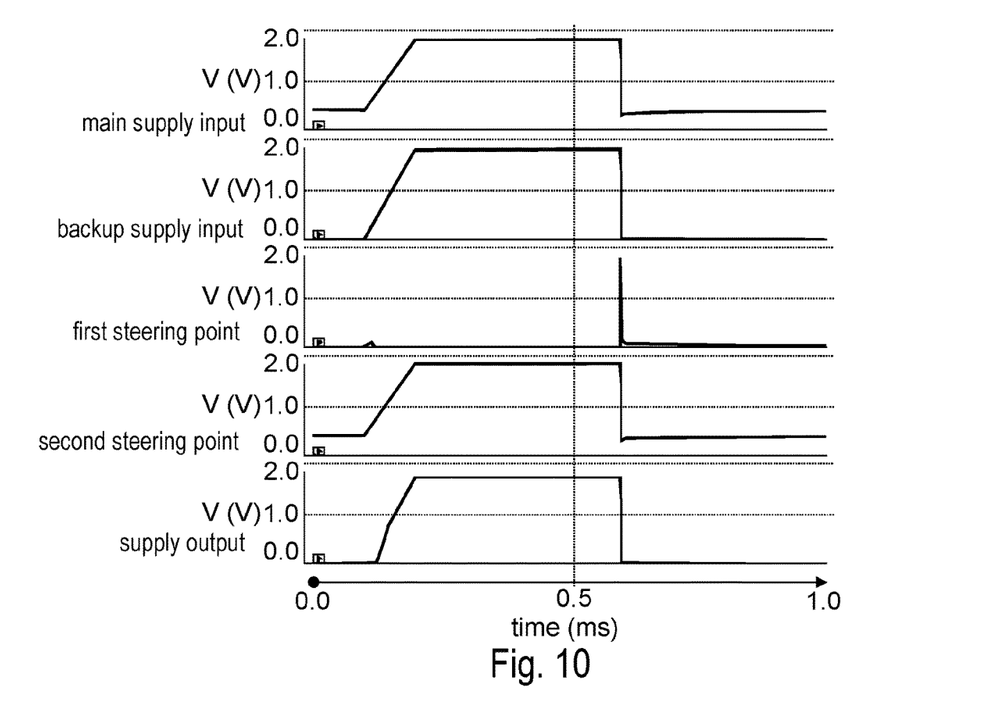

FIG. 10 shows an example of the voltage signals at the stated locations, if the main supply source connected to the main supply input 2 and the backup supply source connected to backup supply input 3 RAMP UP together switching ON and are then FLOATING.

Figure 11:
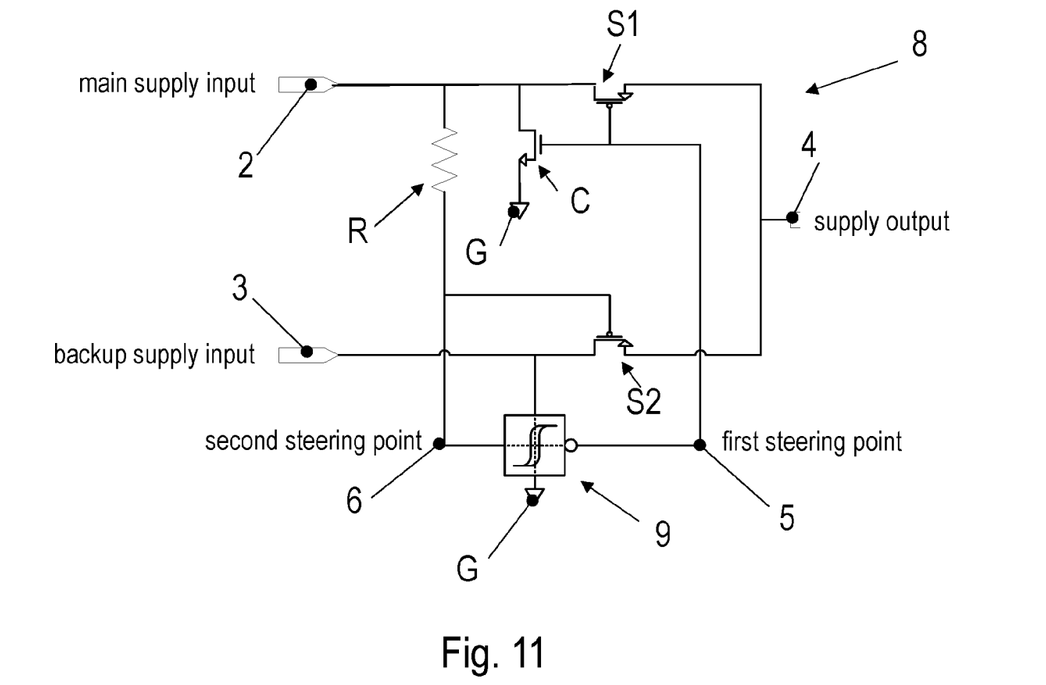
FIG. 11 shows a second embodiment of an autonomous power supply switch according to the invention using transistors of the PMOS type.

FIG. 11 shows a second embodiment of a claimed autonomous power supply switch 8 that is realized with a Schmitt trigger 9 instead of the inverter 7 of the embodiment in FIG. 1. All other elements are the same as in the embodiment shown in FIG. 1. The Schmitt trigger 9 introduces hysteresis so that the ON switch threshold voltage is higher than the OFF switch threshold voltage. This prevents any oscillations on the first steering point 5 in case of relatively high startup current load on the supply output 4 that causes the voltage on an unbuffered supply connected to the main supply input 2 to spike down.

FIG. 12 shows a third embodiment of a claimed autonomous power supply switch 10 that is similar to the first embodiment with the inverter 7 as shown in FIG. 1, but uses transistors of the NMOS type. Due to the different types of transistors, the gate of the first switch transistor S1 has to be connected with the second steering point 6 and the gate of the second switch transistor S2 has to be connected with the first steering point 5 to achieve the same logic functionality.

Figure 13:
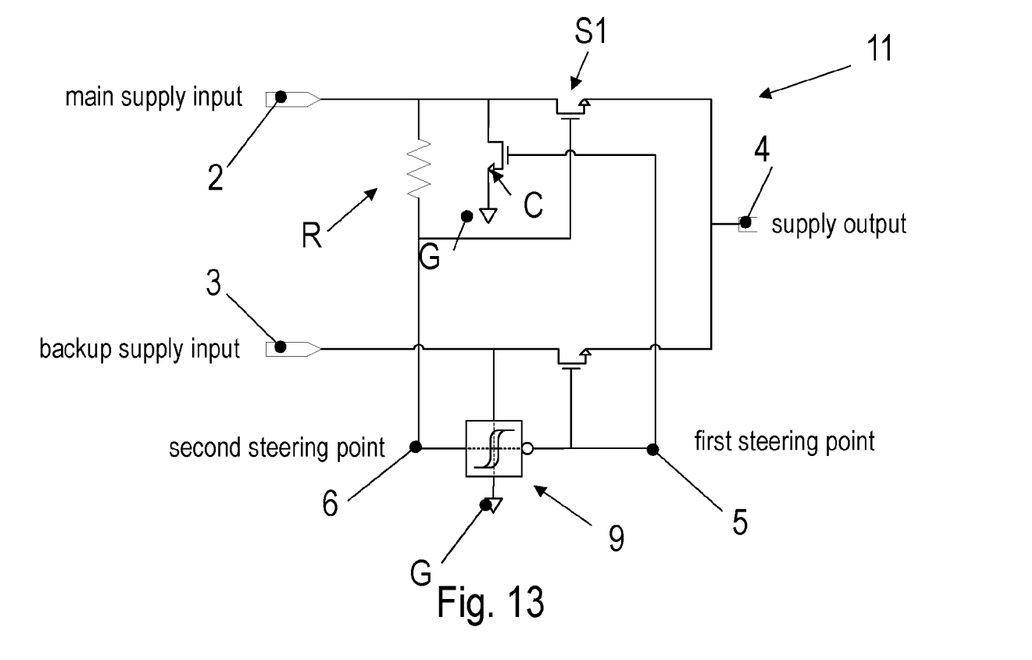
FIG. 13 shows a fourth embodiment of the invention that is similar to the second embodiment as shown in FIG. 11, but uses transistors of the NMOS type.

FIG. 13 shows a fourth embodiment of claimed autonomous power supply switch 11 that is similar to the second embodiment with the Schmitt trigger 9 as shown in FIG. 11, but uses transistors of the NMOS type. Due to the different types of transistors, the gate of the first switch transistor S1 has to be connected with the second steering point 6 and the gate of the second switch transistor S2 has to be connected with the first steering point 5 to achieve the same logic functionality.

The autonomous power switches 1 and 8 as shown in FIGS. 1 and 11 are the preferred embodiments due to the diode connections formed at autonomous power switches 10 and 11 as shown in FIGS. 12 and 13 when either one of the NMOS switch transistors S1 or S2 turns ON and thus causes a voltage drop between input and output that is inherently higher than the potential voltage drop when using autonomous power switches 1 or 8 with PMOS type transistors. However, this does not mean that the autonomous power switches 10 and 11 with the NMOS type transistors do not have advantages as well. Although the PMOS embodiments are more efficient, in some scenarios NMOS type transistors are advantageous due to the diode connection preventing reverse current flow back to the main supply input 2 and the backup supply input 3.

With above examples it becomes clear that for all these different constellations of supply inputs the autonomous power supply switch 1 always switches correctly and rapidly in a robust way. Therefore, supply redundancy for critical power consumers is provided with a simplistic approach to autonomously switch between the available power sources. Powering down parts of the chip is allowed, without losing functionality in critical blocks.

The autonomous power supply switch 1 of FIG. 1 could be realized by discrete parts or within an integrated circuit.

The type and specification of the switch transistors will enable higher or lower supply power/supply voltages to be switched.

The invention claimed is:

1. An autonomous power supply switch with a main supply input and a backup supply input and a supply output to which a power consumer may be connected to supply the power consumer with power provided at the main supply input and to switch to the backup supply input, if the power provided at the main supply input is below a switch threshold, wherein the switch comprises:
   a first switch transistor (S1) of the PMOS type connected between the main supply input and the supply output with its source and bulk connected to the supply output and with a gate of the first switch transistor connected to a first steering point of the switch;
   a second switch transistor (S2) of the PMOS type connected between the backup supply input and the supply output with its source and bulk connected to the supply output and with a gate of the second switch transistor connected to a second steering point of the switch;
   an inverter or Schmitt trigger with its input connected to the second steering point and its output connected to the first steering point and its power supply connected to the backup supply input of the switch; and
   an ohmic resistor (R) connected between the main supply input and the second steering point of the switch to protect the second switch transistor (S2) and the inverter of the switch against voltage spikes.

2. The autonomous power supply switch according to claim 1, wherein the power supply switch further comprises:
   a control transistor (C) connected between the main supply input and ground potential (G) with its gate/base connected to the first steering point.

3. The autonomous power supply switch according to claim 2, wherein the control transistor (C) is a weak pull-down transistor to pull the potential of the main supply input to ground potential (G), if the power provided at the main supply input is floating.

4. A method to supply a power consumer connected to an autonomous power supply switch according to claim 1 with power from the main supply input or the backup supply input, wherein the method comprises the following steps:
   connecting the main supply input with the supply output via the first switch transistor (S1) and disconnecting the backup supply input from the supply output via the second switch transistor (S2), if power provided at the main supply input is above the switch threshold; and
   connecting the backup supply input with the supply output via the second switch transistor (S2) and disconnecting the main supply input from the supply output via the first switch transistor (S1), if power provided at the main supply input is below the switch threshold or floating.

5. The method according to claim 4, wherein the method comprises the following further steps:
   connecting the main supply input with ground potential (G) via the control transistor (C), if power provided at the main supply input is below the switch threshold.

6. An autonomous power supply switch with a main supply input and a backup supply input and a supply output to which a power consumer may be connected to supply the power consumer with power provided at the main supply input and to switch to the backup supply input, if the power provided at the main supply input is below a switch threshold, wherein the switch comprises:
   a first switch transistor (S1) of the NMOS type connected between the main supply input and the supply output with a gate of the first switch transistor connected to a second steering point of the switch and its bulk connected to ground potential (G);
   a second switch transistor (S2) of the NMOS type connected between the backup supply input and the supply output with a gate of the second switch transistor connected to a first steering point of the switch and its bulk connected to ground potential (G);
   an inverter or Schmitt trigger with its input connected to the second steering point and its output connected to the first steering point and its power supply connected to the backup supply input of the switch; and
   an ohmic resistor (R) connected between the main supply input and the second steering point of the switch to protect the first switch transistor (S1) and the inverter of the switch against voltage peaks.

7. The autonomous power supply switch according to claim 6, wherein the power supply switch further comprises:
   a control transistor (C) connected between the main supply input and ground potential (G) with its gate/base connected to the first steering point.

* * * * *